(12) United States Patent
Zhu

(10) Patent No.: US 7,808,240 B2
(45) Date of Patent: Oct. 5, 2010

(54) APPARATUS AND METHOD FOR OPTIMIZING THE SPECTRA OF PARALLEL EXCITATION PULSES

(75) Inventor: Yudong Zhu, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 12/112,703

(22) Filed: Apr. 30, 2008

(65) Prior Publication Data

US 2009/0273346 A1 Nov. 5, 2009

(51) Int. Cl.
*G01V 3/00* (2006.01)
(52) U.S. Cl. ........................ 324/309; 324/307
(58) Field of Classification Search .......... 324/309, 324/307, 318
See application file for complete search history.

(56) References Cited

U.S. PATENT DOCUMENTS

| | | | |
|---|---|---|---|
| 6,879,158 | B2 | 4/2005 | Zhu |
| 6,989,673 | B2 | 1/2006 | Zhu |
| 7,042,214 | B2 * | 5/2006 | Cunningham et al. ....... 324/307 |
| 7,053,618 | B2 | 5/2006 | Zhu |
| 7,307,419 | B2 | 12/2007 | Zhu et al. |

OTHER PUBLICATIONS

Zhu et al., "Transmit Coil Array for Accelerating 2D Excitation on an Eight-Channel Parallel Transmit System," Proc. Intl. Soc. Mag. Reson. Med., vol. 14, 2006, p. 122.
Zhu, "RF Power Deposition and "g-factor" in Parallel Transmit," Proc. Intl. Soc. Mag. Reson. Med., vol. 14, 2006, p. 599.
Zhu et al., "Parallel Excitation on an Eight Transmit-Channel MRI System," Proc. Intl. Soc. Mag. Reson. Med., vol. 13, 2005, p. 14.
Zhu, "RF Power Reduction with Parallel Excitation," Proc. Intl. Soc. Mag. Reson. Med., vol. 11, 2004, p. 331.
Dydak et al., "Sensitivity-Encoded Spectroscopic Imaging," Magnetic Resonance in Medicine, vol. 46, 2001, pp. 713-722.
Zhu et al., "Spectrum Optimized Parallel Excitation Pulse Design", (May 22, 2007).
Zhu, "Parallel Excitation With an Array of Transmit Coils," Magnetic Resonance in Medicine, vol. 51, 2004, pp. 775-784.

* cited by examiner

*Primary Examiner*—Louis M Arana
(74) *Attorney, Agent, or Firm*—Patrick K. Patnode

(57) ABSTRACT

An MRI apparatus includes a magnetic resonance imaging (MRI) system having a magnet to impress a polarizing magnetic field, a plurality of gradient coils positioned about the bore of the magnet to impose a magnetic field gradient, and an RF transceiver system and an RF switch controlled by a pulse module to transmit RF pulses to an RF coil assembly and to acquire MR images, and a computer programmed to apply a plurality of RF pulses configured to control RF excitation by a transmit coil array such that a waveform shape of each of the plurality of RF pulses is based on optimizing a spatial spectrum.

20 Claims, 3 Drawing Sheets

APPARATUS AND METHOD FOR OPTIMIZING THE SPECTRA OF PARALLEL EXCITATION PULSES

BACKGROUND OF THE INVENTION

The invention relates generally to MR imaging and, more particularly, to a method and apparatus of parallel excitation by a transmit coil array to realize desired spatial spectra of excitation pulses.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization," $M_z$, may be rotated, or "tipped," into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well-known reconstruction techniques.

Spatially selective excitation is widely used in MR imaging to induce transverse magnetization while limiting the size of the signal-contributing volume. Slice-selective excitation, the most commonly used excitation, confines the signal-contributing volume to a fixed slice that simplifies spatial encoding during signal acquisition to reduce data acquisition or scan time. Multi-dimensional excitation that produces localization along more than one dimension has been used to further this reduction in scan time. For example, localized spectroscopy, reduced-FOV scan of a region of interest, imaging of a target anatomy of unique shape, and echo planar imaging (EPI) with a shortened echo train length are applications usually implemented because of their support of reduced scan times. In addition, profile (flip, phase, and frequency) control across a sizeable volume with selective excitation has been exploited to improve excitation profile fidelity in the presence of $B_0$ inhomogeneity or gradient non-linearity, and to reduce susceptibility artifacts.

Selective excitation is commonly implemented with a single transmit coil, e.g., a birdcage coil, that transmits across an entire volume and produces a relatively uniform $B_1$ field. Highly efficient pulse algorithms have been developed for designing excitation pulses that suit such a configuration. Notwithstanding the advantages achieved by these pulse design tools, technical difficulties remain. Issues with excitation pulse duration, excitation profile accuracy, and RF power absorption (SAR) represent some of the outstanding challenges in a variety of applications. Compared to 1D excitation, flexible profile control along multiple dimensions with 2D or 3D excitation entails intensified pulsing activity and often requires powerful gradients to keep pulse duration in check. This limitation hinders applications of multi-dimensional excitation on scanners with general-purpose gradients. Substantial subject-dependency of $B_1$ field, resulting from increased wave behavior and source-subject interaction at high frequencies, may also contribute to the difficulty of excitation profile control. An elevated rate of RF power deposition at high frequencies represents yet another factor that has a significant impact on the design and application of RF transmit modules and/or excitation pulses.

Use of adiabatic pulses represents a pulse design approach that addresses the difficulty of excitation profile control associated with $B_1$ inhomogeneity. This approach is limited as its application has been limited to certain profiles and tends to involve high RF power. A $B_1$-field optimization approach that aims at maximizing global $B_1$ homogeneity addresses the control issue through transmit module improvements. Adaptation of the transmit coil geometry or the driving mechanism has been shown to reduce $B_1$ inhomogeneity. At high frequencies, however, the capability of a field optimization approach is limited. Even with calibration-guided adjustment of driving port weights, the degree to which the spatial variation of the composite $B_1$ field approaches a desired level is highly dependent on the characteristics of component $B_1$ fields, and results tend to be subject to considerable residual inhomogeneity.

Another proposed solution to reduce excitation pulse length is based on a parallel excitation architecture—multiple transmit elements driven by independent drivers. Individual $B_1$ field patterns are employed to suppress aliasing lobes arising from sampling density reduction in the excitation k-space. Aliasing sidelobes may be reduced by designing an RF pulse sequence that is specific to each transmit coil to induce spatio-temporal variations in a composite $B_1$ field. However, discontinuities at the object boundary of practically acquired $B_1$ maps may lead to compromises in aliasing sidelobe suppression, and measures taken to produce parallel transmit (Tx) pulses tend to produce pulses having excess energy at high spatial frequencies. This can render pulses that are sensitive to imperfections in the $B_1$ maps as well as perturbations to the $B_1$ mapping process.

Parallel receive (Rx) MRI, to an extent, similarly faces a significant issue of residual aliasing artifacts at low spatial resolution. Yet, while symmetry may exist to an extent between parallel Rx and parallel Tx MR imaging, each provides unique challenges that are not completely analogous to one another. In contrast to parallel Rx, where k-space coverage is typically carried out in segments (one per TR period), segmentation of a parallel excitation pulse over multiple TR periods represents an undesired compromise. Such a constraint together with the constraint of maximum length of the excitation pulse in one TR (due to, for instance, off-resonance and relaxation rates) thus limits the total coverage of the excitation k-space.

It would therefore be desirable to have a system and method capable of realizing desired excitation profiles by reducing excitation pulse length and optimizing the spatial spectra of multiple parallel Tx pulses.

BRIEF DESCRIPTION OF THE INVENTION

The invention provides a system and method of effecting spatiotemporal variations in a composite $B_1$ field created by a transmit coil array that overcomes the aforementioned drawbacks.

Embodiments of the invention are directed to the acceleration of a multi-dimensional excitation through the orchestrated driving of multiple transmit coils. The coordination of multiple transmit elements to effect appropriate $B_1$ spatiotemporal variations in a composite $B_1$ field in order to improve the management of multi-dimensional pulse length while accommodating a k-space coverage constraint is emphasized.

Therefore, in accordance with one aspect of the invention, an MRI apparatus includes a magnetic resonance imaging (MRI) system having a magnet to impress a polarizing magnetic field, a plurality of gradient coils positioned about the bore of the magnet to impose a magnetic field gradient, and an RF transceiver system and an RF switch controlled by a pulse module to transmit RF pulses to an RF coil assembly and to acquire MR images, and a computer programmed to apply a plurality of RF pulses configured to control RF excitation by a transmit coil array such that a waveform shape of each of the plurality of RF pulses is based on optimizing a spatial spectrum.

In accordance with another aspect of the invention, a method of MR imaging includes optimizing shapes of a plurality of RF pulses based on spatial spectra of the plurality of RF pulses, applying the plurality of optimized RF pulses to a transmit coil array, acquiring MR imaging data using the transmit coil array, and reconstructing an MR image based on the acquired MR imaging data.

In accordance with another aspect of the invention, the invention is embodied in a computer program stored on a computer readable storage medium and having instructions which, when executed by a computer, cause the computer to optimize each of a plurality of RF pulse shapes based on a spatial spectrum, apply the RF pulses to a coil array, acquire MR data using the applied RF pulses, and store the acquired MR data to memory.

Various other features, objects and advantages of the invention will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION OF THE PREFERRED EMBODIMENT

Figure 1:
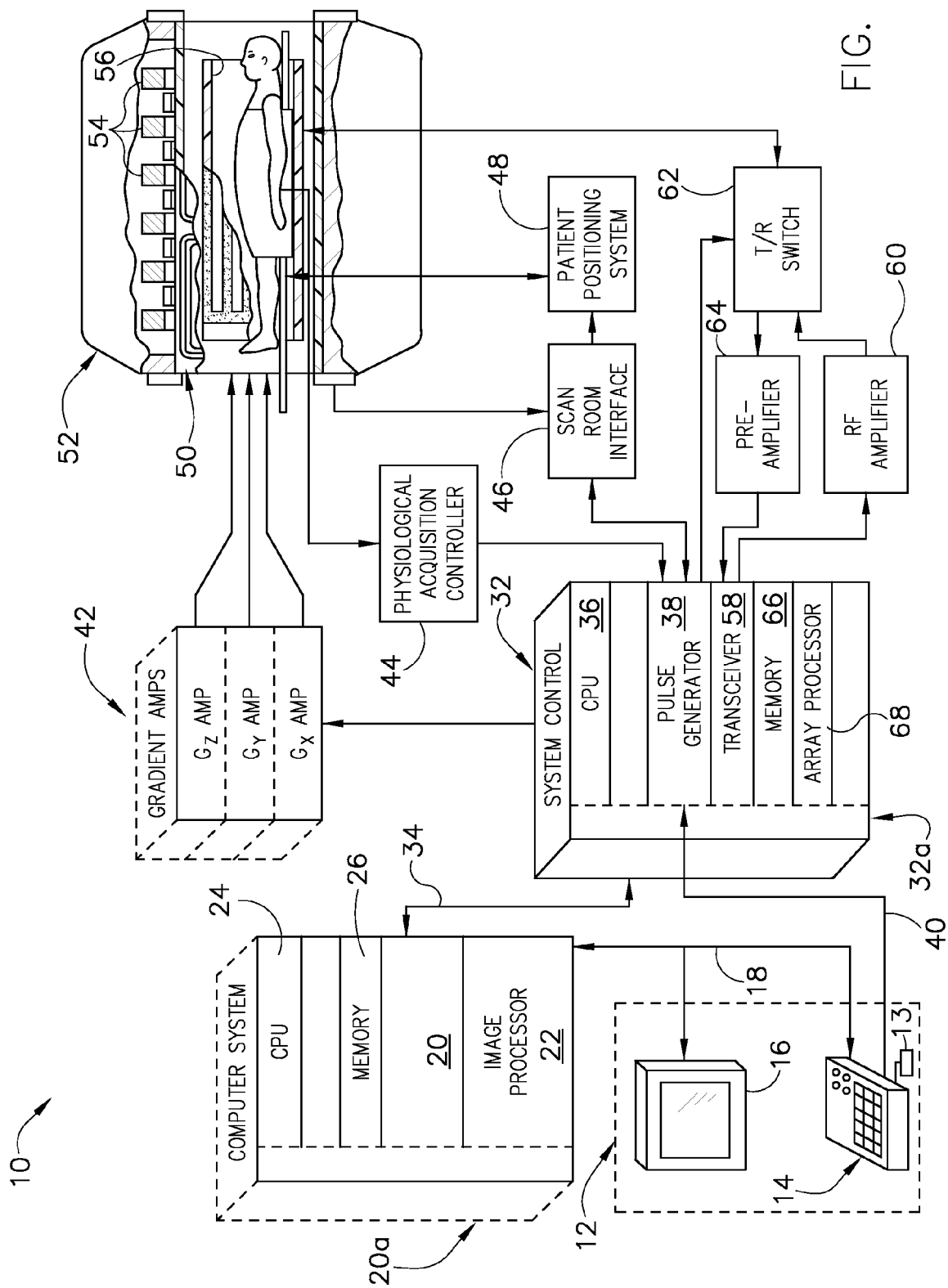
FIG. 1 is a schematic block diagram of an exemplary MR imaging system for use with an embodiment of the invention.

Referring to FIG. 1, the major components of an exemplary magnetic resonance imaging (MRI) system 10 incorporating embodiments of the invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26 that may include a frame buffer for storing image data arrays. The computer system 20 is linked to archival media devices, permanent or back up memory or a network for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

Figure 2:
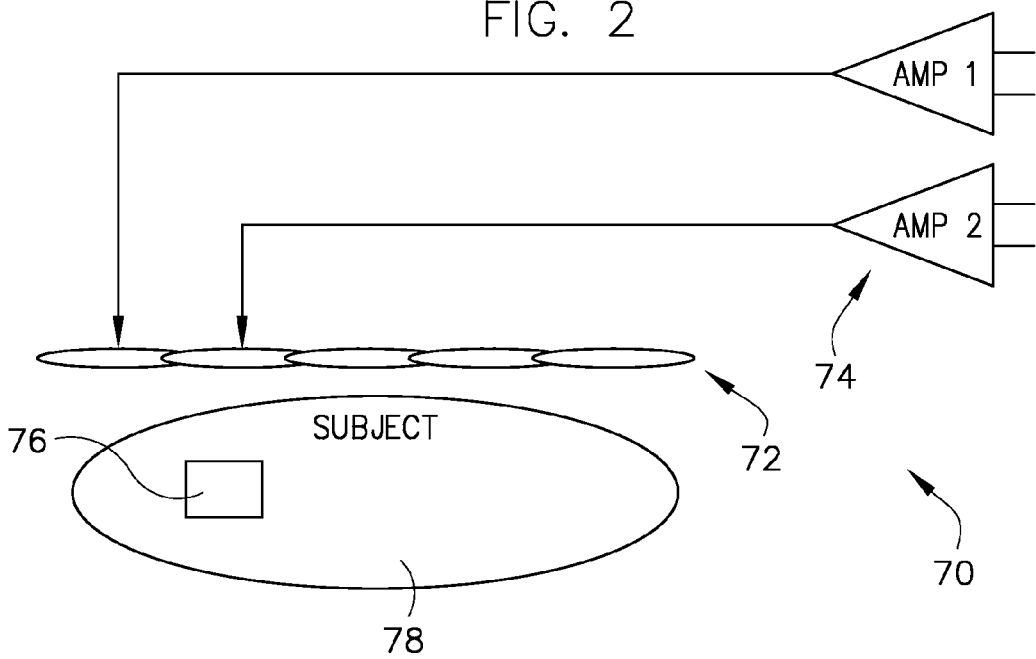
FIG. 2 is a block diagram illustrating a linear transmit coil array assembly in accordance with one aspect of the invention.

Embodiments of the invention is directed to a method and system of accelerating RF pulse transmission by a plurality of transmit coils. Such a transmit coil array is illustrated in FIG. 2. Transmit coil array assembly 70 includes a plurality of RF coils or elements 72 that are designed for parallel RF transmission, and a plurality of RF amplifiers 74. In one preferred embodiment, each transmit coil 72 is driven by a dedicated RF amplifier 74. In this regard, each RF amplifier is configured to generate a controlled current in a respective RF coil for defining and steering an excitation volume 76 of a subject 78 within an MRI system. As illustrated in FIG. 2, the transmit coils 72 are arranged in a substantially linear fashion. Additionally, as will be described, each of the transmit coils may be controlled in a manner such that RF power deposition is further reduced.

Figure 3:
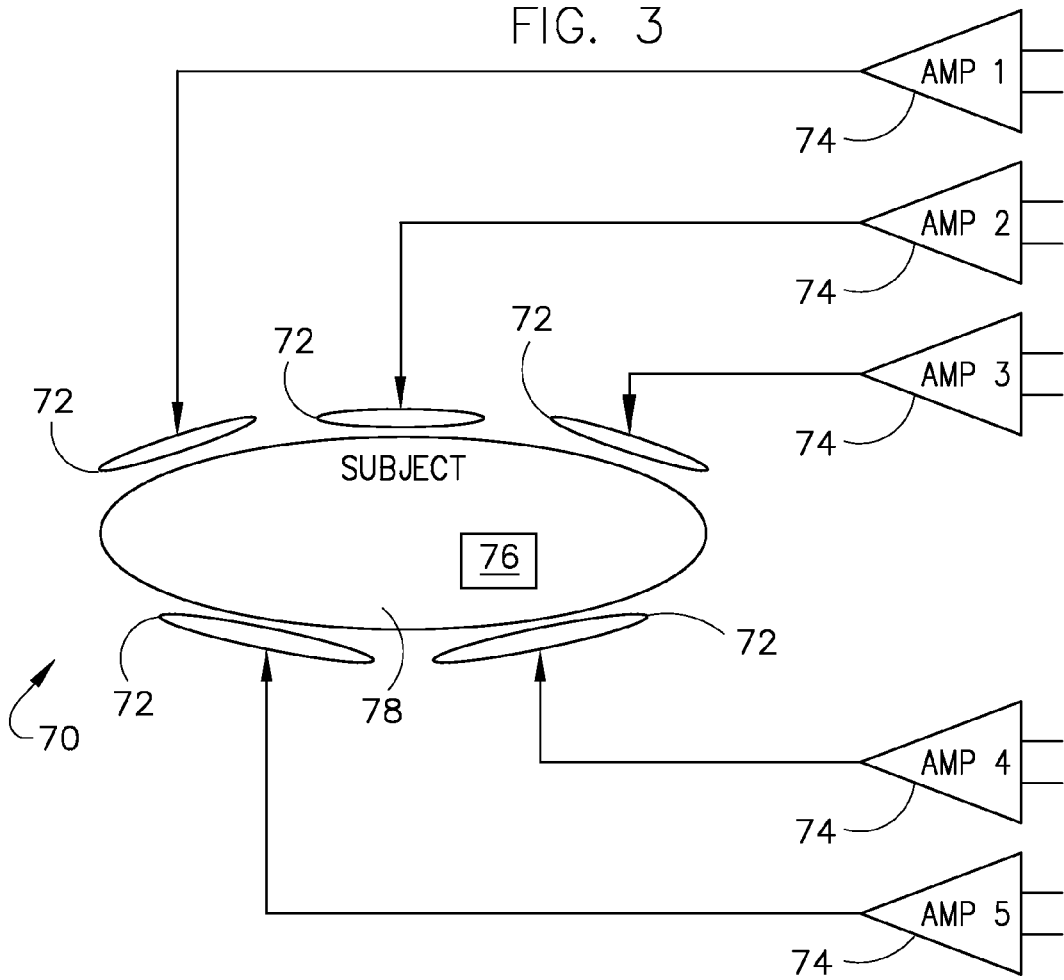
FIG. 3 is a block diagram illustrating a wrap-around transmit coil assembly in accordance with another aspect of the invention.

Referring now to FIG. 3, transmit coil array assembly 70 is illustrated in another embodiment of the invention. In this embodiment, the transmit coils 72 are positioned in a wrap-around manner. In this regard, the coils are arranged in a distributed manner around the subject. Similar to that shown and described with respect to FIG. 2, each RF coil 72 is connected to a dedicated RF amplifier 74. One skilled in the art will recognize that FIGS. 2-3 illustrate a pair of possible arrangements of the coils of a transmit coil array and that other arrangements not specifically illustrated are possible and contemplated.

As indicated above, embodiments of the invention is directed to a method and system operable with a transmit coil array such that RF excitation by the transmit coils is carried out in parallel. This parallel excitation supports a reduction in scan time through the acceleration of RF pulses and the localization of targeted excitation.

Accelerated parallel Tx pulses or algorithms may be designed by incorporating the spatial spectrum optimization technique described below. In an image-space-based design algorithm, creating a target profile (such as producing a main lobe matching a profile and simultaneously suppressing aliasing lobes) corresponds to the following constraints:

$$C_{all}f_{all}=u_{all}, \quad \text{(Eqn. 1)},$$

which is a system of linear equations that pools equations of type $C_{p1,p2}f_{p1,p2}=u_{p1,p2}$. Matrix $C_{all}$ and vector $u_{all}$ are, respectively, properly sampled values of $B_1$ maps and target profiles. The entries for vector $f_{all}$ are values of image-space periodic patterns, which are directly related to parallel RF pulse waveforms through Fourier transforms. If F is a matrix representation of the Fourier transforms, the spatial spectra may be optimized by using a constrained optimization where:

$$\|Wf_{all}\| \text{ is minimized subject to the constraint}$$
$$C_{all}f_{all}=u_{all}, \quad \text{(Eqn. 2)}.$$

Thus, according to an embodiment, W is a positive semi-definite matrix introduced for tailoring spatial spectra of the RF pulses. In a case where W is set to be a diagonal matrix, a relatively large or small entry on the diagonal, as an example, would penalize or reward the inclusion of a spectral component of a pulse, thus respectively suppressing or enhancing the component in the design outcome. However, in a low-pass filtering case, where it may be desirable to exclude spectral components above a certain spatial frequency, a least squares solution to the following equation may be an alternative:

$$C_{all}Ea_{all}=u_{all}, \quad \text{(Eqn. 3)}.$$

In this embodiment, "$Ea_{all}$" expresses coil-specific image-space periodic patterns with sums of sampled spatial harmonics, and vector $a_{all}$ collects coefficients of the spatial harmonics.

The spatial spectra may be optimized by including SAR or RF power considerations as well. As an example, Eqn. 2 can be extended to give:

$$f_{all}*\Phi f_{all}+\alpha\|Wf_{all}\| \text{ is minimized subject to the constraint } C_{all}f_{all}=u_{all} \quad \text{(Eqn. 4)},$$

where $f_{all}*\Phi f_{all}$ integrates all $f_{p1,p2}*f_{p1,p2}$ values and tracks total RF power dissipation, and $\alpha$ is a constant used to weight and optimize the sum of the two expressions of Eqn. 4. Thus, by forming a single metric (Eqn. 4) having a weighted sum of the two expressions summed therein, a balanced optimization between both SAR/RF power and pulse spectra is obtained.

Figure 4:
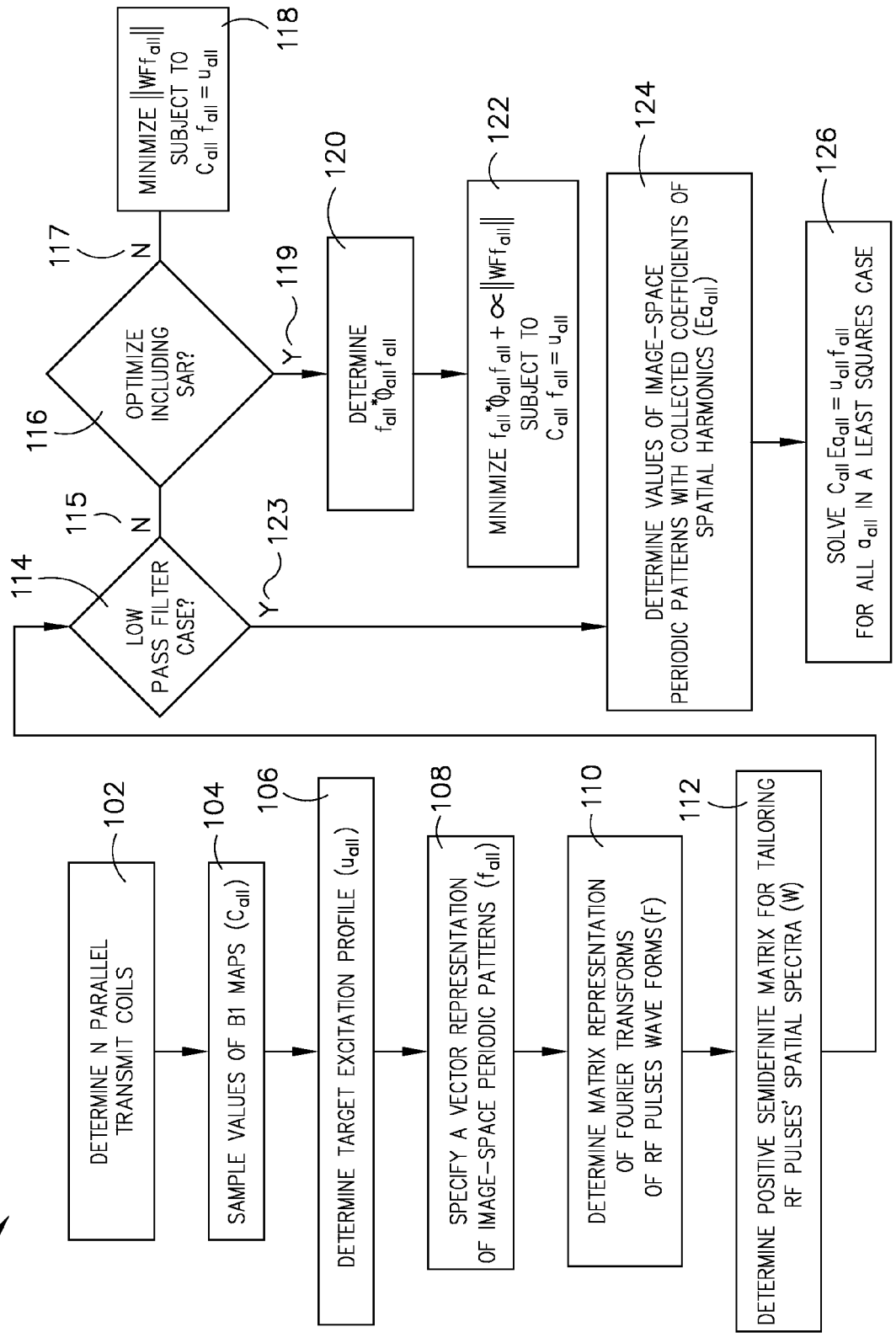
FIG. 4 is a flowchart illustrating improved spatial spectrum optimization of a plurality of parallel transmit pulses according to embodiments of the invention.

Accordingly, an embodiment of the invention may be illustrated according to the flowchart showing a pulse design technique 100 as illustrated in FIG. 4. At 102, a number N of parallel transmit coils are determined, and at 104, sample values of $B_1$ maps are obtained, $c_{all}$. At 106, a target excitation profiles $u_{all}$ is determined. A vector representation of image-space periodic patterns $f_{all}$ is specified at 108, and a matrix representation of Fourier Transforms of RF pulse waveforms, F, is obtained at 110. At 112 a positive semi-definite matrix, W, for tailoring RF pulses' spectra is determined. At 114, technique 100 determines whether a low pass filter is included. If an optimization does not include a low pass filter, 115, then technique 100 determines whether SAR is included in the optimization at 116. If optimization does not include SAR, 117, then at 118, the spatial spectrum is optimized by solving Eqn. 2. However, if SAR is included in the optimization, 119, then $f_{all}*\Phi f_{all}$ is determined at 120, and Eqn. 4 is solved at 122. In an optimization that includes a low pass filter, 123, the values of image-space periodic patterns is determined at 124 with collected coefficients of spatial harmonics E $a_{all}$, and Eqn. 3 is solved at 126.

The pulse design technique described herein was evaluated in a set of parallel Tx experiments, where an eight-channel Tx-only array was used to excite a uniform disc phantom oriented in an axial plane, and a body coil was used for receive. A 2DFT gradient-echo sequence was used to acquire projection images in z, which mapped the magnetization distribution in a 30-cm field-of-view (FOV). A first experimental study compared 4× accelerated parallel excitation designed with, respectively, a solution using Eqn. 1 and using the disclosed technique as illustrated with respect to Eqn. 3, which uses a low-pass filter. Results from the first experimental study showed significant profile improvements by ensuring the quality of parallel excitation profiles, including full-FOV (uniform) as well as local region-of-interest (ROI) profiles.

A second experimental study evaluated a 5.7 ms parallel excitation pulse (4-fold acceleration; EPI trajectory with peak gradient strength <1.6 Gauss/cm) designed with the disclosed algorithm. Results from the second experimental study illustrated a sophisticated excitation profile over the full FOV.

With embodiments of the invention, spectrum-optimized RF pulses are designed, synthesized, amplified, and fed to corresponding transmit elements in parallel to induce both spatial and temporal variations of the composite $B_1$ field, which, accompanied by appropriate gradient changes played out in synchrony, create a desired excitation profile upon completion of excitation. One skilled in the art will recognize that inducing appropriate $B_1$ spatiotemporal variations for excitation bears significant ramifications on RF excitation performance. That is, parallel excitation accommodates excitation acceleration and/or SAR control without substantial sacrifice in the accuracy of producing the desired excitation profile.

According to an embodiment of the invention an MRI apparatus includes a magnetic resonance imaging (MRI) system having a magnet to impress a polarizing magnetic field, a plurality of gradient coils positioned about the bore of the magnet to impose a magnetic field gradient, and an RF transceiver system and an RF switch controlled by a pulse module to transmit RF pulses to an RF coil assembly and to acquire MR images, and a computer programmed to apply a plurality of RF pulses configured to control RF excitation by a transmit coil array such that a waveform shape of each of the plurality of RF pulses is based on optimizing a spatial spectrum.

According to another embodiment of the invention a method of MR imaging includes optimizing shapes of a plurality of RF pulses based on spatial spectra of the plurality of RF pulses, applying the plurality of optimized RF pulses to a transmit coil array, acquiring MR imaging data using the transmit coil array, and reconstructing an MR image based on the acquired MR imaging data.

According to yet another embodiment, the invention is embodied in a computer program stored on a computer readable storage medium and having instructions which, when executed by a computer, cause the computer to optimize each of a plurality of RF pulse shapes based on a spatial spectrum, apply the RF pulses to a coil array, acquire MR data using the applied RF pulses, and store the acquired MR data to memory.

A technical contribution for the disclosed method and apparatus is that it provides for a computer implemented use of parallel excitation by a transmit coil array to realize desired spatial spectra of excitation pulses.

The invention has been described in terms of the preferred embodiment, and it is recognized that equivalents, alternatives, and modifications, aside from those expressly stated, are possible and within the scope of the appending claims.

What is claimed is:

1. An MRI apparatus comprising:
   a magnetic resonance imaging (MRI) system having a magnet to impress a polarizing magnetic field, a plurality of gradient coils positioned about the bore of the magnet to impose a magnetic field gradient, and an RF transceiver system and an RF switch controlled by a pulse module to transmit RF pulses to an RF coil assembly and to acquire MR images; and
   a computer programmed to apply a plurality of RF pulses configured to control RF excitation by a transmit coil array such that a waveform shape of each of the plurality of RF pulses is based on optimizing a spatial spectrum.

2. The MRI apparatus of claim 1 wherein the computer is further programmed to determine waveform shapes of the plurality of RF pulses subject to a constrained optimization that is based on at least sampled values of B1 maps and a target excitation profile.

3. The MRI apparatus of claim 1 wherein the computer is further programmed to optimize the spatial spectrum by mathematically minimizing an expression utilizing a positive semidefinite matrix introduced for tailoring RF pulse spatial spectra, a matrix representation of RF pulse Fourier transforms, and a vector of values of image-space patterns.

4. The MRI apparatus of claim 1 wherein optimization of the waveform shape of each of the plurality of RF pulses is further based on SAR considerations.

5. The MRI apparatus of claim 4 wherein the computer is further programmed to optimize the spatial spectrum by mathematically minimizing an expression that includes a positive semidefinite matrix that is introduced for tailoring the RF pulse spatial spectra, a matrix representation of RF pulse Fourier transforms, a vector of values of image-space patterns, and an expression that integrates the values and tracks total RF power dissipation.

6. The MRI apparatus of claim 1 wherein the computer is further programmed to determine the plurality of transmit pulse shapes by obtaining a least squares solution to an expression that includes coil-specific image-space patterns and coefficients of spatial harmonics.

7. The MRI apparatus of claim 1 wherein the computer is further programmed to exclude a plurality of components of the spatial spectrum above a desired spatial frequency via a low-pass filter.

8. A method of MR imaging comprising:
   optimizing shapes of a plurality of RF pulses based on spatial spectra of the plurality of RF pulses;
   applying the plurality of optimized RF pulses to a transmit coil array;
   acquiring MR imaging data using the transmit coil array; and
   reconstructing an MR image based on the acquired MR imaging data.

9. The method of claim 8 further comprising constraining the optimization based on sampled values of B1 maps and based on a target excitation profile.

10. The method of claim 8 wherein optimizing the shapes comprises mathematically minimizing an expression using a positive semi-definite matrix introduced for tailoring the spatial spectra of the plurality of RF pulses.

11. The method of claim 10 wherein mathematically minimizing includes mathematically minimizing a function that includes a matrix representation of RF pulse Fourier transforms and a vector of values of image-space patterns.

12. The method of claim 8 wherein optimizing the shapes further comprises:
   optimizing the shapes of the plurality of RF pulses based on SAR considerations; and
   determining the shapes of the plurality of RF pulses by mathematically minimizing an expression that includes a positive semi-definite matrix that is introduced for tailoring the RF pulse spatial spectra, a matrix representation of RF pulse Fourier transforms, a vector of values of image-space patterns, and an expression that integrates the values and tracks total RF power dissipation.

13. The method of claim 8 wherein optimizing the shapes comprises optimizing the shapes of the plurality of RF pulses based on a metric that includes RF power of the plurality of RF pulses and the spatial spectra of the plurality of RF pulses.

14. The method of claim 8 wherein optimizing the shapes comprises excluding spectral components above a spatial frequency by obtaining a least squares solution to an expression that includes coil-specific image-space patterns and coefficients of spatial harmonics.

15. A computer readable storage medium having stored thereon a computer program comprising a set of instructions, which, when executed by a computer, cause the computer to:
   optimize each of a plurality of RF pulse shapes based on a spatial spectrum;
   apply the RF pulses to a coil array;
   acquire MR data using the applied RF pulses; and
   store the acquired MR data to memory.

16. The computer readable storage medium of claim 15 wherein the set of instructions further causes the computer to:
   sample B1 maps;
   specify a target excitation profile; and
   wherein the set of instructions that causes the computer to optimize each of the plurality of RF pulse shapes causes the computer to optimize the plurality of RF pulse shapes based on the sampled B1 maps and the target excitation profile.

17. The computer readable storage medium of claim 15 wherein the set of instructions that causes the computer to optimize each of the plurality of RF pulse shapes causes the computer to optimize the plurality of RF pulse shapes by mathematically manipulating an expression that includes a positive semidefinite matrix and RF pulse spatial spectra.

18. The computer readable storage medium of claim 17 wherein the set of instructions that causes the computer to mathematically manipulate an expression causes the computer to mathematically manipulate a matrix representation of RF pulse Fourier transforms and a vector of values of image-space patterns.

19. The computer readable storage medium of claim 15 wherein the set of instructions that causes the computer to optimize each of the plurality of RF pulse shapes causes the computer to optimize the plurality of RF pulse shapes based on a metric that includes both RF power and pulse spectra.

20. The computer readable storage medium of claim 15 wherein the set of instructions that cause the computer to optimize each of the plurality of RF pulse shapes, cause the computer to optimize the plurality of RF pulse shapes by excluding spectral components above a spatial frequency and obtaining a least squares solution to an expression that includes coil-specific image-space patterns and coefficients of spatial harmonics.

* * * * *